United States Patent

Tada

Patent Number: 5,147,175
Date of Patent: Sep. 15, 1992

[54] WAFER TRANSFER DEVICE FOR A SEMICONDUCTOR DEVICE FABRICATING SYSTEM

[75] Inventor: Keishi Tada, Kanagawa, Japan

[73] Assignee: Sony Corporation, Japan

[21] Appl. No.: 813,665

[22] Filed: Dec. 27, 1991

[30] Foreign Application Priority Data

Jan. 10, 1991 [JP] Japan .................. 2-13771

[51] Int. Cl.⁵ .................................. B25J 18/00
[52] U.S. Cl. .......................... 414/749; 74/98;
74/89.22; 414/744.5; 901/25
[58] Field of Search ............ 414/749, 751, 744.5;
901/21, 23, 25; 74/98, 89.22

[56] References Cited

U.S. PATENT DOCUMENTS 4,730,976 3/1988 Davis et al. .................... 414/749

FOREIGN PATENT DOCUMENTS

WO87/07078 11/1987 PCT Int'l Appl.

Primary Examiner—Robert J. Spar
Assistant Examiner—Donald W. Underwood
Attorney, Agent, or Firm—Ronald P. Kananen

[57] ABSTRACT

A semiconductor wafer transfer device includes a rotary member, a driving member which rotates coaxially with the rotary member, a driven member which is driven by the driving member and a frog leg linkage having a first link with an end fixed to the driving member, a second link with an end fixed to the driven member, a third link having an end pivotally joined to another end of the first link, and a fourth link having an end pivotally joined to the other end of the second link. A wafer support plate is supported on the other ends of the third and fourth links. An auxiliary escape mechanism is provided for moving the frog leg linkage out of its dead point. The mechanism includes a first pulley coaxillary fixed to the rotary member with the driving member, a second pulley rotatably supported on a pivot shaft pivotally joining the first and the third links, and a belt wound around the first and second pulleys. The radius of the first pulley is greater than the center distance between the driving member and the driven member. The diameter of the second pulley is smaller than that of the first pulley.

2 Claims, 5 Drawing Sheets

WAFER TRANSFER DEVICE FOR A SEMICONDUCTOR DEVICE FABRICATING SYSTEM

BACKGROUND OF THE INVENTION

1. Field of the Invention

The present invention relates to a wafer transfer device for a semiconductor device fabricating system and, more particularly, to a revolving frog leg type wafer transfer device for a semiconductor fabricating system.

2. Description of the Prior Art

Techniques for a semiconductor device manufacturing process for manufacturing a very small semiconductor device with a high accuracy must be capable of transferring a semiconductor substrate from one processing chamber to the next processing chamber for subsequent processing without changing the quality of the surface of the semiconductor substrate. Nevertheless, in transferring a semiconductor wafer from one chamber after completing a process, such as an etching process, in the chamber to the next chamber for the next process, such as a CVD process, in a practical process, the semiconductor wafer is exposed to the atmosphere. Consequently, oxide films are formed by natural oxidation over portions of a wiring film exposed to through holes. In most cases, such oxide films must be removed because the oxide films increase contact resistance. The removal of the oxide films formed by natural oxidation requires immersing the semiconductor wafer in an etchant and washing the semiconductor wafer to wash off the etchant. Consequently, the process needs additional steps and the throughput of the process is reduced. To deal with such problems, a multichamber semiconductor fabricating system comprising a plurality of processing chambers connected by gate valves has been developed and proposed in, for example, NIKKEI MICRODEVICES, Oct., 1989, pp. 34–39.

The multichamber semiconductor device fabricating system needs a wafer transfer device capable of smoothly sending a semiconductor wafer into and smoothly taking out the semiconductor wafer from each processing chamber to carry out efficiently the semiconductor fabricating process. FIG. 4 shows a prior art frog leg type semiconductor wafer transfer device proposed for such a purpose.

Referring to FIG. 4, a bottomless, cylindrical member 1 has a flange at its upper end (only the flange is shown in FIG. 4) fastened directly or indirectly to a horizontal shielding plate 2 so that the cylindrical member is held in a vertical position on the shielding plate 2, a bottomless, outer rotary tube 3 (only its upper end is shown in FIG. 4) is supported on the cylindrical member 1 by a magnetic fluid, an inner rotary tube 4 is inserted in and supported by a linear motion bearing on the outer rotary tube 3, and a bellows 5 is fixed at its lower end to the upper end of the outer rotary tube 3 and at its upper end to the circumference of the upper end of the inner rotary tube 4. The inner rotary tube 4 rotates together with the outer rotary tube 3 when the outer rotary tube 3 is rotated by driving means, such as a motor, not shown, and is capable of being moved vertically by lifting means, not shown. A driving shaft 6 is inserted in and supported by a magnetic fluid, not shown, on the inner rotary tube 4, and a driving gear 7 is fixed to the upper end of the driving shaft 6 projecting upward from the upper end of the inner rotary tube 4. A link 8a is joined at its one end to the driving gear 7. A shaft 9 is attached to the upper end of the inner rotary tube 4, and a driven gear 10 is supported on the shaft 9 so as to engage the driving gear 7. A link 8b having a length equal to that of the link 8a is joined at its one end to the driven gear 10. The driving shaft 6 is rotated by a motor, not shown; consequently, the link 8a turns in the same direction as a direction in which the driving shaft 6 is rotated and the link 8b joined to the driven gear 10 turns in the opposite directions. Thus, the links 8a and 8b turn respectively in opposite direction.

One end of a link 11a is joined pivotally to the other end of the link 8a, and one end of a link 11b is joined pivotally to the other end of the link 8b. Mating gears 12 are provided on the other ends of the links 11a and 11b. Thus, the links 8a, 8b, 11a and 11b form a frog leg type linkage. A wafer support plate 13 is held on the other ends of the links 11a and 11b by the shafts of the gears 12. The wafer support plate 13 is capable of supporting a semiconductor wafer 14.

The situation of the frog leg linkage consisting of the links 8a, 8b, 11a and 11b can be changed by turning the outer rotary tube 3, and the frog leg linkage can be stretched or contracted by rotating the driving gear 6 to advance or retreat the wafer support plate 13. The wafer support plate 13 can vertically be moved by vertically moving the inner rotary tube 4 by the lifting means. The wafer support plate 13 must be moved vertically up and down in a predetermined range in transferring the semiconductor wafer 14 from a wafer transfer station in the chamber to the wafer support plate 13 and vice versa.

Processing chambers 15 to which the semiconductor wafer 14 is supplied and from which the semiconductor wafer is taken out by the wafer transfer device are arranged around the wafer transfer device. In FIG. 4, only one of the processing chambers 15 is indicated by alternate long and two short dashes lines for simplification. Shown also in FIG. 4 are gate valves 16 provided between the wafer transfer device and the processing chambers 15, respectively, gates 17 through which the semiconductor wafer 14 is passed, wafer detectors 18 for detecting the semiconductor wafer 14, and a discharge port 19.

When the frog leg linkage of the wafer transfer device shown in FIG. 4 is contracted in a state where the links 8a, 8b, 11a and 11b thereof are aligned with a straight line with the front end of the frog leg linkage located above the driving gear 6 as shown in FIG. 6, it is difficult to stretch the frog leg linkage in such a state, because a large torque must be applied to the links 8a and 8b in stretching the frog leg linkage from the fully contracted state similarly to folding the unfolded blade of a jack-knife. Such a phenomenon is called a jackknife phenomenon. If the frog leg linkage is locked in the fully contracted state by the jackknife phenomenon, the chamber containing the wafer transfer device and evacuated to a high vacuum must be opened and the frog leg linkage must be operated by hand so that the frog leg linkage can be stretched. Once the chamber is opened to expose the interior thereof to the atmosphere, the inner surface of the walls of the chamber is wetted by moisture contained in the atmosphere and the chamber must be evacuated to the high vacuum, which requires a long time and the multichamber apparatus is held inoperative for several hours or several days. Consequently, the operating ratio of the production system including the multichamber semiconductor fabricating system is reduced and thereby the manufacturing cost of the semiconductor device is increased. Therefore, the jackknife phenomenon must unconditionally be avoided.

The inventors of the present invention attempted to construct the frog leg linkage and the associated mechanisms so that the front end of the frog leg linkage may not be located above the driving gear 7 when the frog leg linkage is fully contracted as shown in FIG. 6. For example, the range of rotation of the driving gear 7 was narrowed.

However, the attempt caused another problem that affects adversely to the improvement of the throughput.

Originally, the frog leg type wafer transfer device is capable of contracting the stretched frog leg linkage so that the wafer support plate 13 passes over the driving gear (hereinafter, such a movement of the wafer support plate 13 will be called "transition past the dead point") and of stretching the frog leg linkage in the opposite direction. If the frog leg linkage can be stretched and contracted in opposite directions in such a manner, the stroke of the wafer support plate 13 is twice the length of the frog leg linkage corresponding to a length twice the length of the links, and the wafer support plate 13 can be moved past the driving gear 7 (hereinafter referred to as "dead point") in opposite directions. If the frog leg linkage is capable of such motions, the semiconductor wafer 14 can be transferred from one chamber to a diametrically opposite chamber only by the action of the frog leg linkage without turning the frog leg linkage. Such capability of the frog leg linkage improves the throughput effectively. Furthermore, if the wafer support plate 13 is provided with two wafer mounts to support two semiconductor wafers at a time, the throughput can further be improved. However, if the range of rotation of the driving gear 7 is narrowed so that the frog leg linkage cannot be retracted in a fully retracted state as indicated by continuous lines in FIG. 6 to avoid the jackknife phenomenon, the wafer support plate 13 is unable to move past the dead point, the stroke of the wafer support plate 13 is reduced by half, it is impossible to transfer the semiconductor wafer 14 from one processing chamber to another processing chamber without turning the frog leg linkage, the capability of supporting two semiconductor wafers of the wafer support plate 13 becomes almost meaningless, and the significant improvement of the throughput cannot be achieved.

The inventors of the present invention attempted to reduce torque necessary for driving the fully contracted frog leg linkage to make the frog leg linkage escape from the dead point, by combining an auxiliary escape mechanism with the frog leg linkage. As shown in FIG. 5, the auxiliary escape mechanism comprises a pulley 20 fixed to the driving gear 7, a pulley 21 having a diameter half times that of the pulley 20 and rotatably supported on a joint joining the links 8a and 11a, and a belt 22 extended between the pulley 20 and the pulley 21. Torque to be produced by an escape motor for driving the auxiliary escape mechanism is expressed by:

$$M = 2FL^2/r$$

where M is the torque to be produced by a motor, F is the force necessary for moving the wafer support plate 13 out of the dead point above the driving gear 6, L is the length of the links 8a, 8b, 11a and 11b, and r is the radius of the pulley 20, i.e., the diameter of the pulley 21.

The auxiliary escape mechanism, however, has problems that the required torque M increases with the length L of the links, it is possible that the belt 22 is broken if the required torque M is very large, and it is possible that the step out of the motor occurs.

Although the inventors of the present invention intended to reduce the torque M necessary for moving the frog leg linkage out of the dead point by increasing the diameter of the pulley 20, the inventors imagined that the diameter of the pulley 20 may be limited by the center distance between the driving gear 6 and the driven gear 10 because the pulley 20 is fixed to the driving gear 6 engaging the driven gear 10. Thus, it was considered that there is a limit to the reduction of the torque by increasing the diameter of the pulley 20 and it is difficult for the auxiliary escape mechanism to overcome the difficulty.

SUMMARY OF THE INVENTION

However, the inventors of the present invention became aware that the positional relation between the driven gear 7 and the pulley 20 is fixed and it is possible to increase the radius of the pulley 20 beyond the center distance between the driving gear 6 and the driven gear 10, and made the present invention on the basis of such a fact.

Accordingly, it is an object of the present invention to provide a wafer transfer device for a semiconductor device fabricating system, provided with a frog leg linkage capable of being moved out of its dead point by a relatively small torque and of being stretched in opposite directions through its dead point.

In a first aspect of the present invention, a wafer transfer device comprises: a frog leg linkage comprising a first link connected at one end thereof to a driving gear, a second link connected at one end thereof to a driven gear engaging the driving gear, a third link having one end pivotally joined to the other end of the first link and the other end pivotally joined to a wafer support plate, and a fourth link having one end pivotally joined to the other end of the second link and the other end pivotally joined to the wafer support plate; and an auxiliary escape mechanism employing a pulley having a radius greater than the center distance between the driving gear and the driven gear.

In a second aspect of the present invention, the wafer support plate of the wafer transfer device in the first aspect of the present invention is capable of supporting two wafers thereon.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
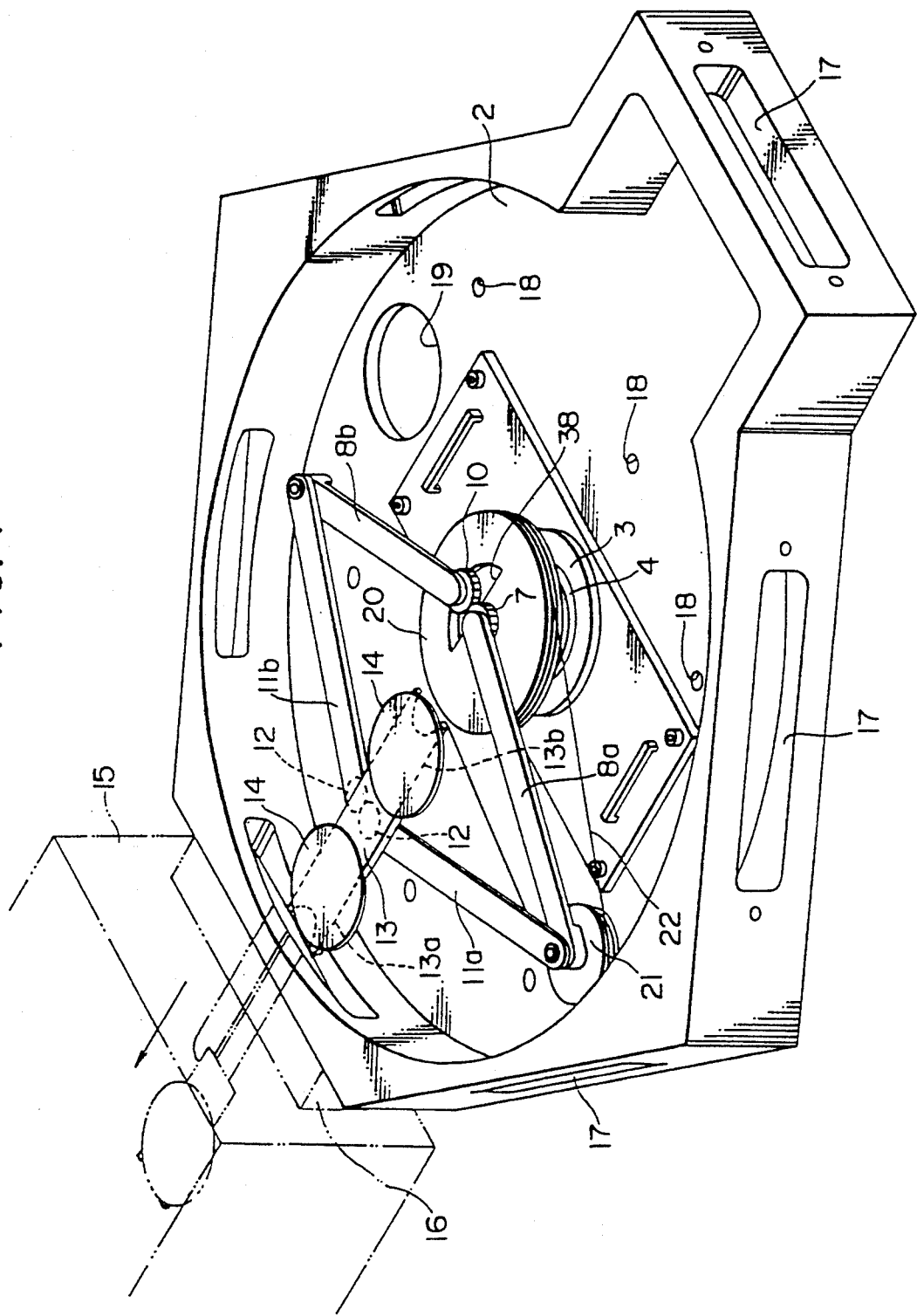
FIG. 1 is a perspective view of a wafer transfer device in a first embodiment according to the present invention.
Figure 2:
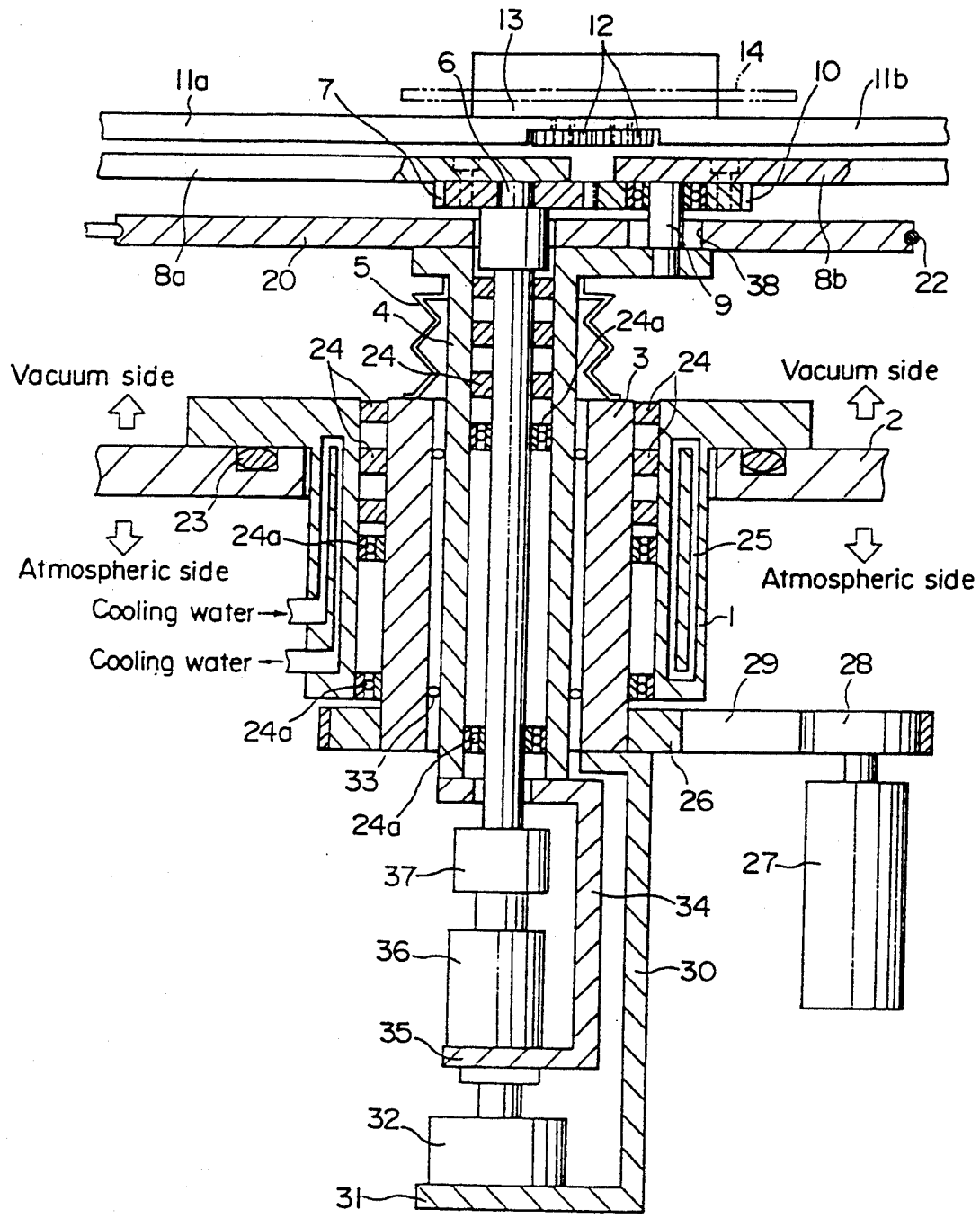
FIG. 2 is a longitudinal sectional view of the wafer transfer device of FIG. 1.
Figure 3:
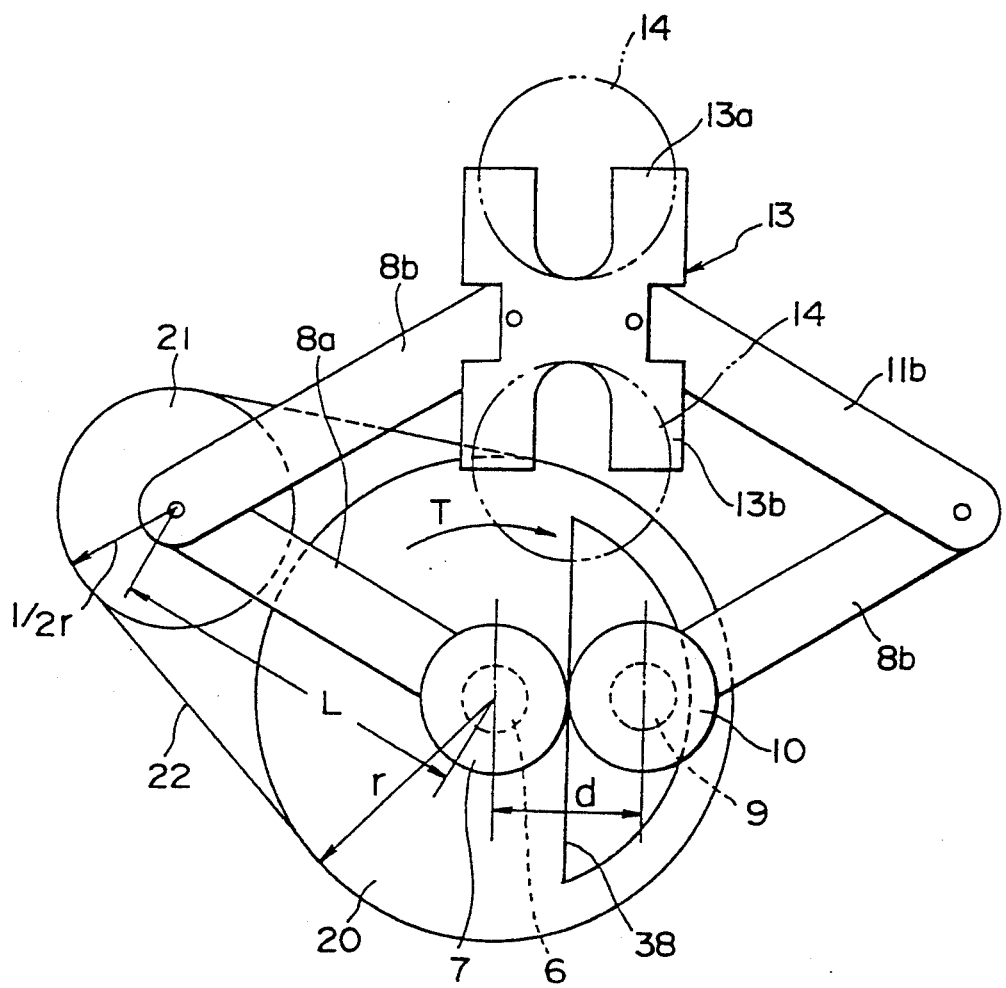
FIG. 3 is a plan view of assistance in explaining principle on which the present invention is based.
Figure 4:
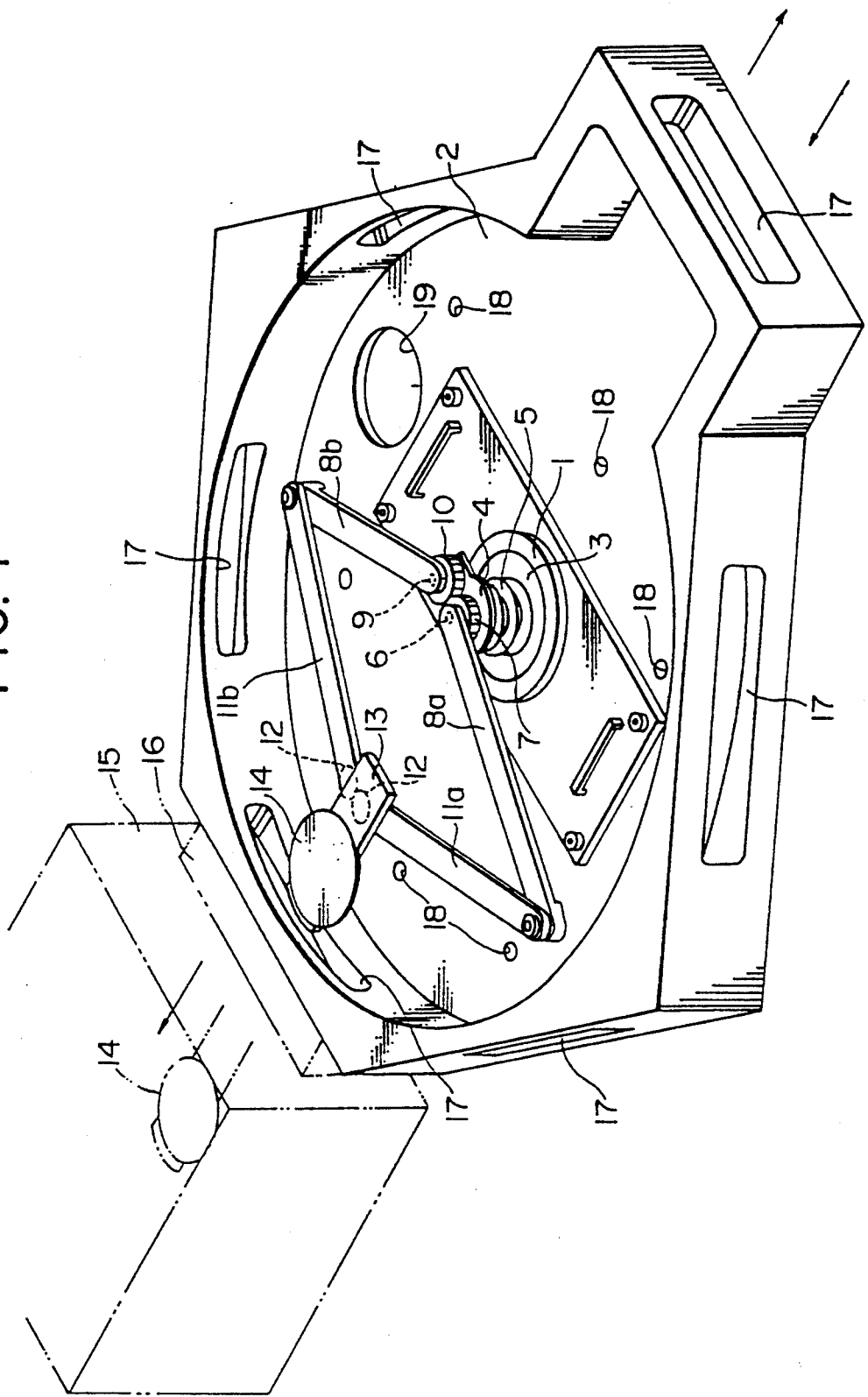
FIG. 4 is a perspective view of a prior art wafer transfer device.
Figure 5:
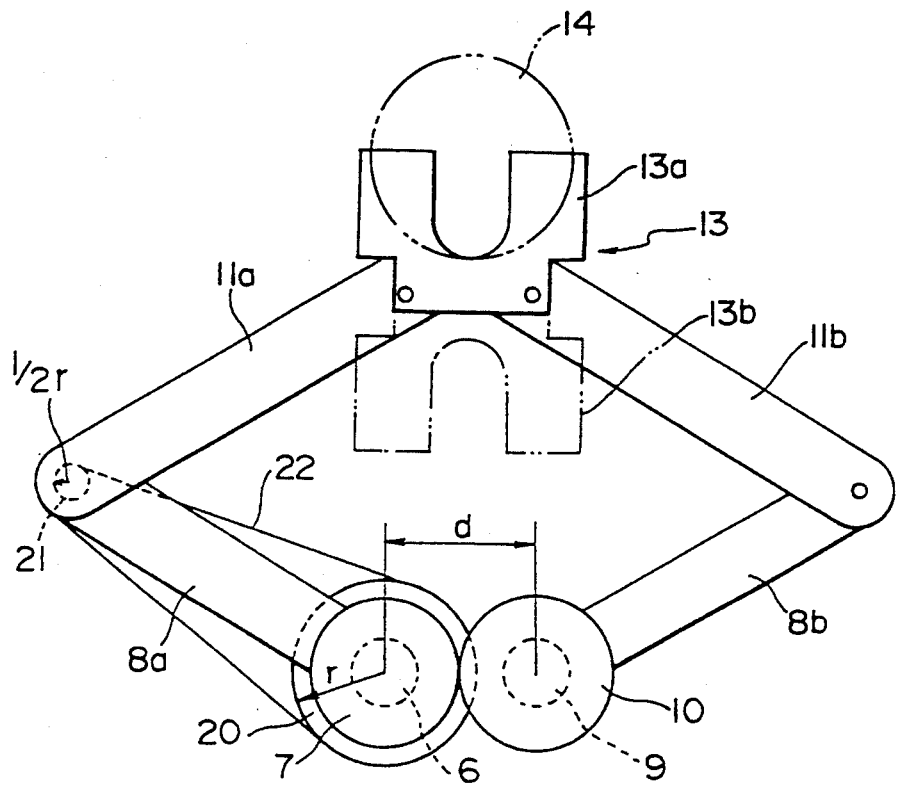
FIG. 5 is a plan view of an auxiliary escape mechanism for moving a frog leg linkage out of its dead point, contrived previously by the inventors of the present invention prior to the present invention.
Figure 6:
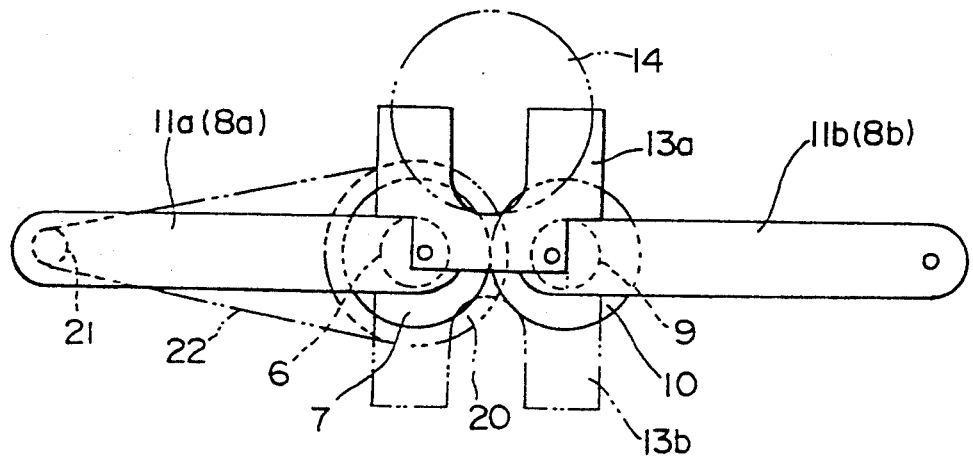
FIG. 6 is a plan view of assistance in explaining a jackknife phenomenon which is a problem in the wafer transfer device of FIG. 4.

A wafer transfer device in a first embodiment according to the present invention shown in FIGS. 1 to 3 are similar in construction to the prior art wafer transfer device which has been described with reference to FIG. 4. Therefore parts in FIGS. 1 to 3 like or corresponding to those previously described with reference to FIG. 4 are denoted by the same reference characters and the description thereof will be omitted to avoid duplication.

Referring to FIGS. 1 and 2, a bottomless cylindrical member 1 has a flange seated on a horizontal shielding plate 2 with an O-ring 23 therebetween and is fastened to the shielding plate 2, and an outer rotary tube 3 is supported for rotation in the cylindrical member 1 by a magnetic fluid 24 and bearings 24a. A cooling water passage 25 is formed in the cylindrical member 1 to circulate cooling water to remove heat generated by the rotation of the outer rotary tube 3. A driving pulley 28 is fixed to the output shaft of a dc servomotor 27, a driven pulley 26 is fixed to the lower end of the outer rotary tube 3, and a timing belt 29 is extended between the driving pulley 28 and the driven pulley 26 to drive the outer rotary tube 3 for rotation by the dc servomotor 27 to turn a frog leg linkage, which will be described later.

A support bracket 30 is attached to the lower end of the outer rotary tube 3, and a cylinder actuator 32 is held on the lower arm 31 of the support bracket 30. An inner rotary tube 4 is supported for vertical movement relative to the outer rotary tube 3 in a linear motion bearing 33 in the outer rotary tube 3. A motor support member 34 is attached to the inner rotary tube 4, and a dc servomotor 36 for stretching and contracting a frog leg linkage is supported on the lower support arm 35 of the motor support member 34 in alignment with a driving shaft 6. The output shaft of the dc servomotor 36 and the driving shaft 6 are coupled by a coupling 37. The output torque of the dc servomotor 36 may be transmitted through a harmonic speed changer to the driving shaft 6 without any backlash. The driving shaft 6 may be supported in the inner rotary tube 4 by a magnetic fluid 24 and bearings 24a. The lower support arm 35 of the motor support member 34 is connected to the extremity of the piston of the cylinder actuator 32. The motor support member 34 is moved vertically by the cylinder actuator 32, so that the dc servomotor 36, the driving shaft 6 and the frog leg linkage connected to the driving shaft 6 are moved integrally for vertical motion.

A first pulley 20 is fixed to the upper end of the inner rotary tube 4 coaxially with the driving shaft 6. The first pulley 20 has a radium far greater than the center distance d between the driving shaft 6 and a driven shaft 9. A second pulley 21 is fixed to a pivot shaft pivotally joining a links 8a and 11a. The second pulley 21 has a diameter half times the diameter of the first pulley 20. A wire 22 or a belt is wound around the first pulley 20 and the second pulley 21. A clearance 38 is formed in the first pulley 20 for a driven shaft 9 projecting from the upper end of the inner rotary tube 4 and supporting a driven gear 10. The driven shaft 9 may be attached to the first pulley 20. The first pulley 20, the second pulley 21 and the wire 22 constitute an auxiliary escape mechanism for helping the frog leg linkage fully contracted with the wafer support plate 13 at the dead point to move out of the fully contracted state.

The output torque $M = 2FL^2/r$ of the dc servomotor 36 necessary for moving the wafer support plate 13 out of the dead point is relatively small because the radius r of the first pulley 20 of the auxiliary escape mechanism is far greater than the center distance d between the driving shaft 6 and the driven shaft 9. Accordingly, a relatively small torque is sufficient to move the wafer support plate 13 out of the dead point. Consequently, there is no possibility that the wire 22 is broken because the wire 22 is not subjected to a large force in moving the wafer support plate 13 out of the dead point, and no possibility that the dc servomotor 36 steps out. Thus, the frog leg linkage of the wafer transfer device is capable of being stretched in opposite directions past the dead point, so that the wafer transfer device is able to transfer a wafer 14 from one of the processing chambers to another processing chamber disposed diametrically opposite to the former with respect to the wafer transfer device without turning the frog leg linkage. Furthermore, the semiconductor wafer 14 can efficiently be transferred between the processing chambers by the combination of the stretching and contracting motion and the turning motion of the frog leg linkage.

The wafer support plate 13 of the wafer transfer device in this embodiment is provided with two wafer mounts 13a and 13b arranged along the direction of stretching and contracting motion of the frog leg linkage to transfer two semiconductor wafers 14 simultaneously, which further enhances the wafer transfer efficiency of the wafer transfer device.

The performance of the wafer transfer device provided with two wafer mounts 13a and 13b, and that of the conventional wafer transfer device provided with only one wafer mount in carrying out four sequences will be compared on an assumption that time necessary for turning the frog leg linkage is 3 sec, time necessary for stretching the frog leg linkage is 2 sec, time necessary for contracting the frog leg linkage is 2 sec, time necessary for raising the frog leg linkage is 1 sec, time necessary for lowering the frog leg linkage is 1 sec, time necessary for pickup turning is 1 sec, time necessary for opening the gate valve is 1 sec, time necessary for closing the gate valve is 1 sec, and at least five processing chambers A to E or at least six processing chambers A to F are arranged around the wafer transfer device.

A first sequence transfers a wafer 14 sequentially through the processing chamber A (45 sec), the processing chamber B (40 sec), the processing chamber C (60 sec), the processing chamber D (30 sec) and the processing chamber E (40 sec) in that order. Times in parentheses are durations for which the semiconductor wafer 14 is held in the processing chambers, respectively.

A second sequence transfers a wafer 14 sequentially through the processing chamber A (50 sec), the processing chamber B (30 sec), the processing chamber C (60 sec), the processing chamber D (30 sec), the processing chamber E (60 sec) and the processing chamber F (10 sec) in that order.

A third sequence transfers a wafer 14 through the processing chamber A (10 sec), the processing chamber B (30 sec), the processing chamber C (60 sec), the processing chamber D (40 sec), the processing chamber E (45 sec), the processing chamber F (10 sec) and the processing chamber A (15 sec) in that order.

A fourth sequence transfers a wafer 14 sequentially through the processing chamber A (10 sec), the processing chamber B (45 sec), the processing chamber C (30 sec), the processing chamber D (60 sec), the processing chamber C (10 sec) and the processing chamber A (20 sec) in that order.

The throughput, i.e., the number of wafers finished in one hour, of the semiconductor fabricating system provided with the prior art wafer transfer device which is capable of transferring one wafer at a time is thirty-three in the first sequence, twenty-eight in the second sequence, twenty in the third sequence and eighteen in the fourth sequence when the gate valves cannot simultaneously be operated, and thirty-seven in the first sequence, thirty-two in the second sequence, twenty-two in the third sequence and twenty in the fourth sequence when the gate valves can simultaneously be operated.

The throughput of the semiconductor device fabricating system provided with the wafer transfer device embodying the present invention capable of transferring two wafers at a time is forty in the first sequence, thirty-four in the second sequence, thirty in the third sequence and twenty-seven in the fourth sequence when the gate valves cannot simultaneously be operated, and forty-two in the first sequence, thirty-six in the second sequence, thirty-two in the third sequence and twenty-nine in the fourth sequence when the gate valves can simultaneously be operated.

Thus, the throughput of the semiconductor fabricating system provided with the wafer transfer device in accordance with the present invention is higher than that of the semiconductor device fabricating system provided with the prior art wafer transfer device.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A wafer transfer device for a semiconductor device fabricating system, comprising: a rotary member; a driving member disposed for rotation coaxially with the rotary member; a driven member engaging the driving member so as to be driven by the driving member; a frog leg linkage comprising a first link having one end fixed to the driving member, a second link having one end fixed to the driven member, a third link having one end pivotally joined to the other end of the first link, and a fourth link having one end pivotally joined to the other end of the second link; engaging gear means positioned between the other ends of said third and fourth links for providing co-operative movement between said third and fourth links; and a wafer support plate supported on the other ends of the third and fourth links;

the improvement comprising an auxiliary escape mechanism for moving the frog leg linkage out of its dead point, the dead point being the position wherein the links lie along the same horizontal line, comprising a first pulley fixed to the rotary member coaxially with the driving member, a second pulley supported for rotation on a pivot shaft pivotally joining the first link and the third link and having a diameter smaller than that of the first pulley, and a belt wound around the first and second pulleys;

characterized in that the radius of the first pulley is greater than the center distance between the driving member and the driven member.

2. A wafer transfer device according to claim 1, wherein said wafer support plate is provided with two wafer mount.

* * * * *